United States Patent
Morin et al.

(10) Patent No.: US 11,431,021 B2
(45) Date of Patent: Aug. 30, 2022

(54) SOLID ELECTROLYTE BATTERY

(71) Applicants: Commissariat A L'Energie Atomique et aux Energies Alternatives, Paris (FR); INSTITUT POLYTECHNIQUE DE GRENOBLE, Grenoble (FR)

(72) Inventors: Pierrick Morin, Grenoble (FR); Anass Benayad, Grenoble (FR); Renaud Bouchet, La Tronche (FR); Lucie Le Van-Jodin, Grenoble (FR)

(73) Assignees: Commissariat A L'Energie Atomique et aux Energies Alternatives, Paris (FR); INSTITUT POLYTECHNIQUE DE GRENOBLE, Grenoble (FR)

( * ) Notice: Subject to any disclaimer, the term of this patent is extended or adjusted under 35 U.S.C. 154(b) by 630 days.

(21) Appl. No.: 16/388,945

(22) Filed: Apr. 19, 2019

(65) Prior Publication Data
US 2019/0326628 A1    Oct. 24, 2019

(30) Foreign Application Priority Data

Apr. 20, 2018   (FR) ..................... 18 53486

(51) Int. Cl.
*H01M 10/0562* (2010.01)
*C01B 25/16* (2006.01)
(Continued)

(52) U.S. Cl.
CPC ......... *H01M 10/0562* (2013.01); *C01B 25/16* (2013.01); *C23C 14/0057* (2013.01);
(Continued)

(58) Field of Classification Search
CPC .......... H01M 10/0562; H01M 10/431; H01M 10/052; H01M 10/0585; H01M 50/431;
(Continued)

(56) References Cited

U.S. PATENT DOCUMENTS

| 5,338,625 A | 8/1994 | Bates et al. |
| 6,818,356 B1 | 11/2004 | Bates |

(Continued)

FOREIGN PATENT DOCUMENTS

| EP | 2 937 929 A1 | 10/2015 |
| JP | 4016344 | 12/2007 |

(Continued)

OTHER PUBLICATIONS

Machine translation of Japanese Patent Publication No. 2017-033858A, published Feb. 9, 2017. (Year: 2017).*

(Continued)

*Primary Examiner* — Stewart A Fraser
*Assistant Examiner* — Lilia Nedialkova
(74) *Attorney, Agent, or Firm* — Oblon, McClelland, Maier & Neustadt, L.L.P.

(57) ABSTRACT

There is provided a solid electrolyte including at least one layer with no nitrogen and which includes $Li_xPO_yS_z$, with $0<z\leq3$, $2.1\leq x\leq2.4$, and $1\leq y\leq4$. A battery including the electrolyte, and a method for producing the electrolyte, are also provided.

17 Claims, 2 Drawing Sheets

(51) Int. Cl.
 *C23C 14/00* (2006.01)
 *C23C 14/06* (2006.01)
 *H01M 10/0585* (2010.01)

(52) U.S. Cl.
 CPC ..... *C23C 14/0623* (2013.01); *H01M 10/0585* (2013.01); *C01P 2006/40* (2013.01); *H01M 2300/0068* (2013.01)

(58) Field of Classification Search
 CPC ............. H01M 50/497; C23C 14/0057; C23C 14/0623; C01B 25/30; C01B 25/14; C01B 25/16; C01P 2006/40; Y02E 60/10; Y02P 70/50
 See application file for complete search history.

(56) References Cited

U.S. PATENT DOCUMENTS

| | | | | |
|---|---|---|---|---|
| 2004/0048157 | A1* | 3/2004 | Neudecker | H01M 4/0426 |
| | | | | 429/231.2 |
| 2006/0292449 | A1* | 12/2006 | Ota | H01M 4/1395 |
| | | | | 429/322 |
| 2015/0311562 | A1 | 10/2015 | Le Van-Jodin et al. | |
| 2016/0104891 | A1* | 4/2016 | Holme | H01M 4/667 |
| | | | | 429/303 |
| 2017/0331092 | A1* | 11/2017 | Chen | H01M 50/461 |
| 2020/0067126 | A1* | 2/2020 | Han | H01M 10/0565 |

FOREIGN PATENT DOCUMENTS

| | | | |
|---|---|---|---|
| JP | 2011141982 A | * | 7/2011 |
| JP | 2017033858 A | * | 2/2017 |
| WO | WO 2015/158607 A1 | | 10/2015 |

OTHER PUBLICATIONS

Machine translation of Japanese Patent Publication No. 2011-141982A, published Jul. 21, 2011. (Year: 2011).*

Weiss, V. et al. "Reactive magnetron sputtering of tungsten disulfide films: Influence of deposition parameters on texture, microstructure and stoichiometry", Journal of Applied Physics, 101, 103502, published May 16, 2007. (Year: 2007).*

French Preliminary Search Report dated Jan. 22, 2019 in French Application 18 53486, filed on Apr. 20, 2018 (with English translation of categories of cited documents & Written Opinion).

Minami, K., et al., "Electrical and electrochemical properties of glass-ceramic electrolytes in the systems $Li_2S—P_2S_5\_P_2S_3$ and $Li_2S—P_2S_5—P_2O_5$", Solid State Ionics, vol. 192, 2011, pp. 122-125.

Chen, R., et al., "The pursuit of solid-state electrolytes for lithium batteries: from comprehensive insight to emerging horizons", Materials Horizons, The Royal Society of Chemistry, vol. 3, 2016, pp. 1-30.

* cited by examiner

SOLID ELECTROLYTE BATTERY

FIELD OF THE INVENTION

The present invention relates to devices in the field of storing energy electrochemically. This includes battery-type devices, using a solid electrolyte, in particular microbatteries from the microelectronic field.

The invention has an advantageous, but not limiting application, in producing microelectronic devices. By microelectronic device, this means any type of device produced with microelectronic means. These devices comprise, in particular, as well as devices for purely electronic purposes, including memories and capacities, possibly also more complex devices.

TECHNOLOGICAL BACKGROUND

Microbatteries function mainly in the same way as a conventional accumulator, namely by exchanging ions (generally $Li^+$) between two electrodes (an anode and a cathode) through an electrolyte. Microbatteries are however specific in that they are only composed of solid materials, preferably thin layers arranged physically. A low total thickness is had, for example of around a few tens of microns making it possible for a miniaturisation of components while removing any risk of leakage through the absence of liquid components. The solid electrolyte also makes it possible to resort to lithium metal as a negative electrode which is prohibited for liquid electrolyte batteries.

By referring to FIG. 1, such microbatteries are generally produced by successive depositions on a substrate 1 of a first current collector (in this case, in two layers 6, 8), of a first electrode 2, of a solid electrolyte (or ionic conductor) 4, of a second electrode 3, and of a second current collector 7. An encapsulation 5, by means of deposition of additional layers, or by cap extension, is often necessary to protect the chemical reactivity system with oxygen and water vapour. Each portion of electrodes is electrically connected to the outside of the encapsulation by way of connection elements 8, 9, generally via the collectors 6, 7. The current collectors are optional.

The migration of one or more ions between the two electrodes through the electrolyte makes it possible, either to store energy, or to deliver to an external circuit. The quality of this migration is essential for the effectiveness of the microbattery. In particular, reducing the internal resistance is crucial. Several origins of this resistance have been identified, the main origin being the ionic resistance of the solid electrolyte layer, which is characterised by the intrinsic ionic conductivity thereof. Indeed, the higher the conductivity is, the more ions ($Li^+$) are easily moved between the two electrodes by electrical migration events.

Patent publication U.S. Pat. No. 5,338,625 has proposed, in this context, a solid electrolyte material in the form of LiPON. It is an amorphous material, composed of lithium, phosphorus, oxygen and nitrogen. The specific compound which is described here is $Li_xPO_yN_z$ with $x\sim2.8$, $0.16<z<0.46$, $2y=3z\sim7.8$. The conductivity thereof is given at $1.6\times10^{-6}$ S/cm. For the sake of constant improvement, it has then been sought to also improve the level of ionic conductivity. A first approach has been to increase the number of $Li^+$ charge carriers by producing LiPON with targets called "excess lithium targets". Another approach is that presented in patent publication U.S. Pat. No. 6,818,356 B1 with a solid electrolyte in the form of $Li_wPO_xN_yS_z$ with $2.9<w<3.8$, $0.13<y<0.46$ and $0<z<0.2$. The production is copied on that of LiPON by using either a reactive sulphur gas (typically a $N_2+H_2S$ mixture), or by arranging sulphur compound pieces on a $Li_3PO_4$ target. The results stated in this patent publication are an increase in conductivity of LiPON up to 40% for an S/P ratio equal to 0.15.

Thus, the electrolytes based on LiPON appear the most promising for solid ionic conductive batteries. However, there is a need to also improve the ionic conductivity, and more generally the electrical characteristics, solid electrolytes. Indeed, it seems that adding sulphur into the LiPON does not make it possible to achieve the expected increase in ionic conductivity.

It is an aim of the invention, that to overcome at least partially the disadvantages of the current techniques.

SUMMARY OF THE INVENTION

A non-limiting aspect of the invention relates to a solid electrolyte comprising at least one layer with no nitrogen and which comprises $Li_xPO_yS_z$ with $0<z\leq3$. Advantageously, at least one layer consists of $Li_xPO_yS_z$ with $0<z\leq3$.

While the current techniques are oriented towards LiPON-type electrolytes and only consider sulphur as a potential input in intimate association with the nitrogen of the LiPON, the applicant has observed that this orientation is a bias that is overly favourable to LiPON.

It is proposed, according to the present invention, to use sulphur, as such, as an element for improving the properties of the electrolyte (in particular, the ionic conductivity of the $Li^+$ ions). The applicant indeed has observed that the levels of ionic conductivity reached by the LiPONS in microbatteries are not, in practice, as satisfactory as expected. On the one hand, non-conventionally, the invention deviates from LiPON, by removing the nitrogen in the electrolyte. On the other hand, it shows the specific appeal (with no nitrogen) of the sulphur to increase the ionic conductivity of $Li^+$ ions and not only the interest thereof, wholly relative, as an additive to the nitrogen.

Also surprisingly, the results from the applicant also show that the LiPOS offers a reduction in energy for activating the electrolyte layer. At the same time as these advantageous results, the electronic conductivity of the layer does not overly increase, remaining an order of magnitude of six times smaller than the ionic conductivity, which is absolutely acceptable for microbatteries.

Another separable aspect of the present invention relates to a battery, preferably a microbattery, comprising an electrolyte such as indicated above. This battery is preferably "totally solid". It generally has stacked on a face of a substrate:
a first current collector,
a first positive electrode,
the solid electrolyte,
a second negative electrode, conventionally a lithium metal layer, acting as a current collector,
a second current collector and/or one or more encapsulation layers.

Another separable aspect of the present invention relates to a method for producing an electrolyte comprising a step of physical vapour deposition of an electrolyte layer from a $Li_3PO_4$ target, sputtered under reactive atmosphere, preferably with no nitrogen, and comprising at least one sulphur gas, so as to obtain a layer comprising $Li_xPO_yS_z$.

Another separable aspect of the invention relates to a use of $Li_xPO_yS_z$ with no nitrogen, with $0<z\leq3$, to produce a solid electrolyte.

BRIEF DESCRIPTION OF THE FIGURES

Other characteristics, aims and advantages of the present invention will appear upon reading the following detailed description, opposite the appended drawings, given as non-limiting examples, and on which.

The drawings are given as examples and are not limiting of the invention.

DETAILED DESCRIPTION

Before starting a detailed review of embodiments of the invention, below purely optional characteristics are stated which can possibly be used in association or alternatively:

the layer consists of $Li_xPO_yS_z$ with $0<z\leq3$;
possibly, but not in a limiting manner, $z\leq2$;
$2.1\leq x\leq2.4$ and $1\leq y\leq4$;
$3.7\leq y+z\leq4.1$, and preferably $y+z=4$;
the electrolyte can comprise at least one buffer layer on at least one face of the $Li_xPO_yS_z$ layer;
according to one embodiment, at least one buffer layer comprises LiPON;
optionally, a buffer layer is comprised on each face of the at least one $Li_xPO_yS_z$ layer;
preferably, z is such that $0.06\leq z$;
advantageously, x, y and z are such that the ionic conductivity is greater than or equal to $10^{-6}$ S/cm;
the sulphur gas ratio in the atmosphere is between 0.5 and 15%, and is advantageously less than or equal to 10%, even 5%.

Figure 1:
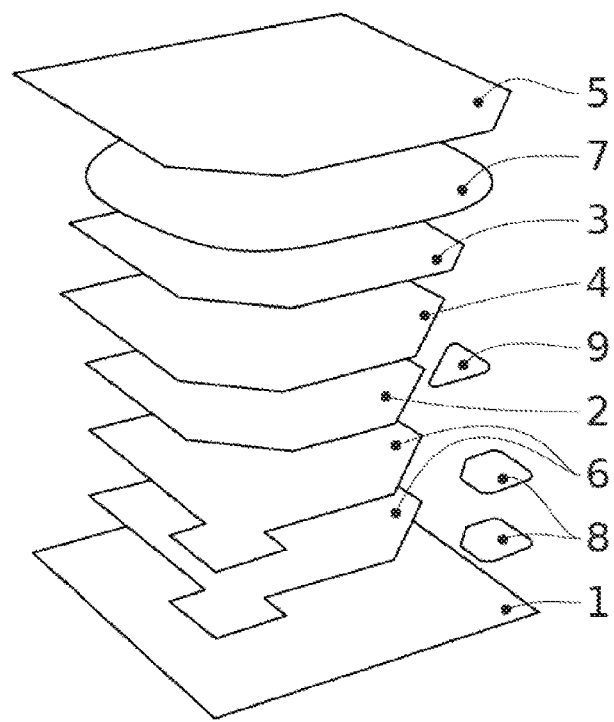
FIG. 1 presents an example of a microbattery structure as an exploded view.

The present invention can be applied to forming a microbattery with a conventional structure, and in particular to that such as illustrated in FIG. 1 described above, and which is produced by the successive stacking of the following layers:

a substrate 1;
a first current collector 6, in this case, in two layers of different materials; the connection of this collector to the outside of the encapsulation layer can be achieved by a first connection element 8;
a first electrode (cathode) 2;
an electrolyte 4;
a second electrode (anode) 3;
a second current collector 7; the connection of this collector with the outside of the encapsulation layer can be achieved by a second connection element 9;
an encapsulation element 5.

The specificity of "totally solid" batteries is to have a solid electrolyte 4. The role of this electrolyte 4 is to ensure the transport of lithium ions from one electrode to another of the battery, while blocking the passage of the electrons. The embodiment most commonly used to produce this electrolyte 4 is the cathodic sputtering of a vacuum target.

The principle of functioning a microbattery is based on the principle of redox of lithium ions transiting between an anode material 3 and a cathode material 2 by the electrolyte 4. The electrons exchanged during these reactions transit through an external circuit ensuring, due to this, the charging or the discharging of the battery.

The input of lithium in the structure can be made by direct use of a lithium metal layer as an anode 3 and in this case, "lithium battery" is referred to, that is by use of at least one lithium electrode material and in this case, "Li-ion battery" is referred to.

According to the invention, a solid electrolyte 4 comprising a layer comprising $Li_xPO_yS_z$ has particularly useful ionic conductivity properties. The values x, y and z are molar fractions. These values are preferably determined by XPS analyses (X-ray photoelectron spectroscopy coupled with a GCIB abrasion (Gas Cluster Ion Beam). Preferably, the index z is selected such that $0<z\leq3$ and advantageously such that $0.06\leq z$; according to one embodiment, to limit the increase of electronic conductivity, z is selected, such that $z\leq3$ and preferably $z\leq2$.

Concerning the indices x and y, they can be set in the following ranges, so as to obtain acceptable stoichiometries: $2.1\leq x\leq2.4$ and $1\leq y\leq4$. Preferably, y+z is equal to 4 or is, at the very least, between 3.7 and 4.1.

Preferably, the electrolyte 4 only comprises one single layer, comprising $Li_xPO_yS_z$. Moreover, even if it is not excluded, that this layer comprises other chemical elements, one advantageous embodiment is that it is only formed of $Li_xPO_yS_z$.

The layer comprising $Li_xPO_yS_z$ according to the invention does not contain nitrogen, but contains a non-zero and controlled proportion of sulphur. However, the ionic conductivity is advantageously greater than the ionic conductivity of the electrolytes of the state of the art. Preferably, the indices x, y and z are selected such that the electrolyte has an ionic conductivity greater than or equal to $10^{-6}$ S/cm, even $10^{-6}$ S/cm.

The solid electrolyte according to the invention is advantageously amorphous.

For information purposes, the role, the chemical nature and the typical thicknesses of each layer of a microbattery, which can be achieved with an electrolyte described above, are described below:

the current collectors are, in particular, metal, and can be, for example, based on Pt, Cr, Au, Ti, W, Mo, Ni. The thicknesses of these current collectors are preferably between 100 nm and 1 µm, generally 250 nm. They are used to conduct the current homogenously up to the electrode 2, 3 with which they are in electrical continuity.

The cathode 2 or the positive electrode can be constituted of $LiCoO_2$, $LiNiO_2$, $LiMn_2O_4$, CuS, $CuS_2$, $WO_yS_z$, $TiO_yS_z$, $LiTiS_2$, $Li_3TiS_3$, $V_2O_5$. According to the materials selected, a thermal annealing can be necessary to increase the crystallisation of films and the insertion property thereof. It is particularly the case for lithium oxides. However, certain amorphous materials, in particular titanium oxysulfides, do not require such a treatment while making it possible for an increased insertion of lithium ions. The thickness of the cathode 2 is preferably between 1 µm and 25 µm. The cathode 2 is the place of reducing lithium during the discharging of the microbattery and the oxidation of it when charging.

The electrolyte 4 according to the invention is such as described above. The thickness can, in particular, be, as tested by the applicant, 1.4 µm, it can vary, for example, between 500 nm and 3 µm, even beyond that.

The anode 3 can be lithium metal deposited by thermal evaporation, a lithium-based metal alloy, or an insertion compound (SiTON, $SnN_x$, $InN_x$, Si, $Li_4Ti_5O_{12}$, $SnO_2$, etc.). There are also microbatteries with no anode, called Li-free. In this case, a metal layer blocking the lithium, is deposited. The lithium initially contained in the positive electrode is thus deposited on this layer which, in this case, is assimilated to an electrode. The thickness of the anode 3 is preferably between 100 nm and 10 μm. The anode 3 is the base of the oxidation of the lithium during the discharging of the microbattery and the reduction during charging.

According to one embodiment, the stack described above is encapsulated. The encapsulation 6 aims to protect the active stack of the external environment and specifically, humidity. Different strategies can be used: encapsulation from thin layers, encapsulation from co-laminates, or also encapsulation by enclosing, such as, for example, a glass cap retained by Parafilm.

According to another aspect, the invention relates to a method for producing an electrolyte such as described above. The method according to the invention comprises a step of vapour deposition of the layer comprising $Li_xPO_yS_z$. This deposition is done from a $Li_3PO_4$-type target. More specifically, the LiPOS deposition can be done by cathodic sputtering advantageously, of the magnetron "RF sputtering" type. Lithium, phosphorous and oxygen are input at least partially by the target. The stoichiometry of the layers obtained is in direction relation to the partial pressure of reactive gas introduced. The latter, in this case, comprises sulphur.

Contrary to the method of the state of the art, nitrogen is not integrated into the layer comprising $Li_xPO_yS_z$. According to one embodiment, the absence of nitrogen is obtained by using a sputtering atmosphere with no nitrogen. It can, for example, be a mixture of argon and $H_2S$.

With the present invention, the composition of deposited films is controlled, in particular by the power, the pressure, the gas used, preferably adjusted directly on the deposition device.

Preferably, the gas flow or the gas mixture is between 20 and 100 sccm, for example, 80 sccm.

Advantageously, the pressure in the chamber is between 0.5 and 2 Pa, preferably equal to 0.7 Pa.

It is understood that the sulphur proportion can be varied in the electrolyte according to the partial sulphur gas pressure in the sputtering atmosphere.

Example: Deposition of an Electrolyte According to the Invention and Measurement of the Performances Thereof for Several Stoichiometric Proportions The electrolyte in the thin layer is deposited with the following parameters:
the target used is $Li_3PO_4$;
a magnetron RF cathodic sputtering is made on a substrate of six inches in diameter made from silicon with $SiO_2$ and $Si_3N_4$ barriers. The LiPOS deposition is done between two titanium layers, each 250 nm thick, also deposited by physical vapour deposition (PVD), so as to form a titanium/electrolyte/titanium structure;
power: 350 W (1.9 W/cm$^2$);
atmosphere of the LiPOS deposition: $(1-t)Ar+tH_2S$ with $0<t<0.1$;
total gas flow: 80 sccm;
sputtering duration: 4 hours and 45 minutes.

The applicant's tests have been carried out according to the parameters above with different $H_2S$ ratios to vary the proportion of sulphur in the electrolyte according to the partial pressure of sulphur gas in the sputtering atmosphere, corresponding to the parameter t indicated above, for the t values equal to 0.005, 0.0125, 0.03, 0.05 and 0.1, which corresponds respectively to a sulphur content in the sputtering atmosphere of 0.5%, 1.25%, 3%, 5% and 10%. A test has been carried out, referentially, with a ratio of 0% (no sulphur during sputtering, that is t=0).

Figure 2:
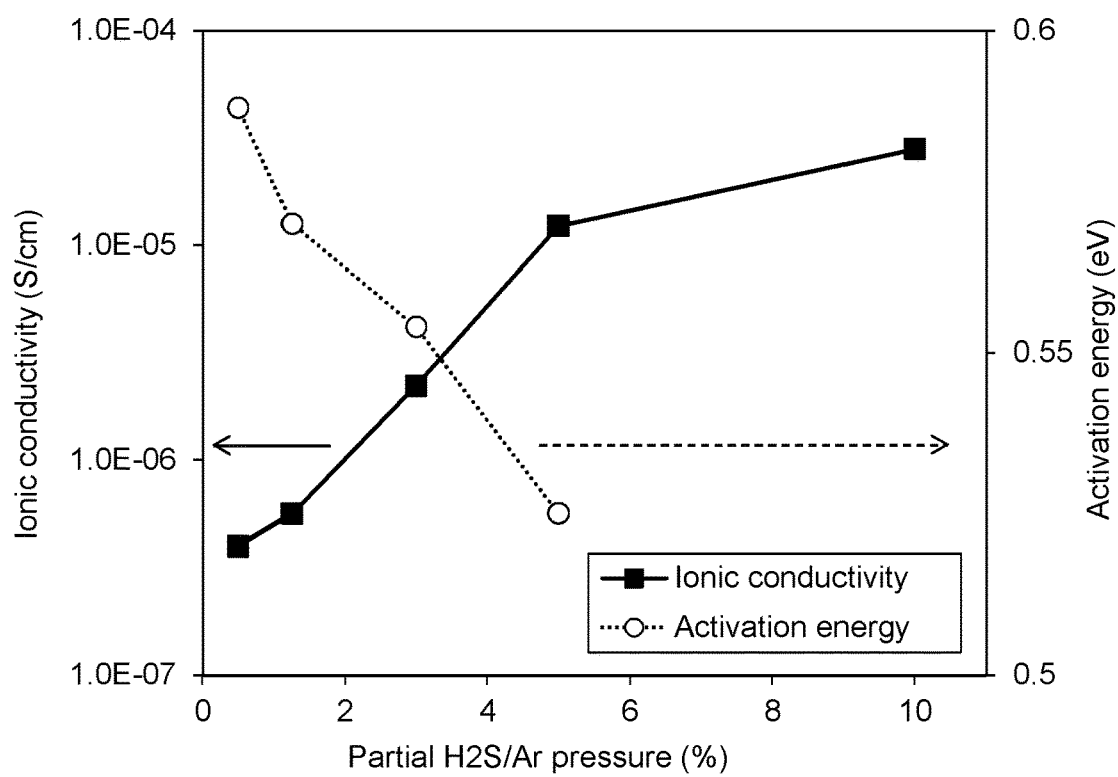
FIG. 2 presents two electrical characteristic curves (ionic conductivity and activation energy) of an electrolyte obtained according to the invention, according to several sulphur content cases.

The ionic conductivity has been measured by electrochemical impedance spectroscopy. The applicant has been able to deduce from the development thereof, for five t values, conductivity and activation energy values by the curves appearing in FIG. 2. The abscissa reflects the sulphur content in an atomic proportion in the LiPOS obtained; the ordinate indicated on the left corresponds to the ionic conductivity in S/cm and the development thereof is shown by the solid line curve; the ordinate indicated on the right corresponds to the activation energy in eV and corresponds to the dotted line curve.

The ionic conductivity grows with the increase in sulphur content, as soon as the proportion thereof is non-zero, and the maximum thereof is obtained at $2.8 \cdot 10^{-5}$ S/cm for a partial pressure of 10% of $H_2S$ in the deposition atmosphere.

It can also be noted, that the increase in ionic conductivity is accompanied by a decrease in the activation energy thereof, an event also welcomed in improving the performances of the electrolyte.

The measured compositions give the stoichiometries summarised in the following table:

| $H_2S$ RATIO (%) | STOICHIOMETRY |
|---|---|
| 0.5 | $Li_{2.39}PO_{4.04}S_{0.02}$ |
| 1.25 | $Li_{2.36}PO_{3.49}S_{0.45}$ |
| 3 | $Li_{2.15}PO_{2.13}S_{1.58}$ |
| 5 | $Li_{2.12}PO_{1.80}S_{1.91}$ |
| 10 | $Li_{2.27}PO_{1.61}S_{2.13}$ |

It can be noted, that adding sulphur is done mainly at the expense of oxygen, going in the direction of a substitution mechanism between these two elements.

It can be desirable to maintain the sulphur content below a limit, preferably such that $z \leq 2$, so as to not obtain a layer that is too rough, the roughness increasing with the sulphur content according to the observations of the applicant. A fissuring can be observed on the electrolyte layer which can create short-circuits in this case, limiting the electrical reliability. Complementarily or alternatively, to limit the roughness of the LiPOS layer, an increase pressure and/or a lower power can be used during the production thereof to reduce the deposition speed.

Another possibility, which can possibly be combined with the information given above, is to associate at least one buffer layer with the LiPOS layer, such that one face, at least, of the LiPOS layer is in contact with a face of the buffer layer. Advantageously, the two faces of the LiPOS layer are each covered by a buffer layer so as to regulate the LiPOS. This solution makes it possible, for at least one of the following effects:
blocking of the electronic conductivity;
forming of an interface with the electrodes with a better chemical compatibility;
improving the mechanical resistance;
protecting the LiPOS, in particular for making watertight.

In this context, the buffer layer(s) can be made of LiPON. The thickness can, for example, be between 10 and 200 nm.

Figure 3:
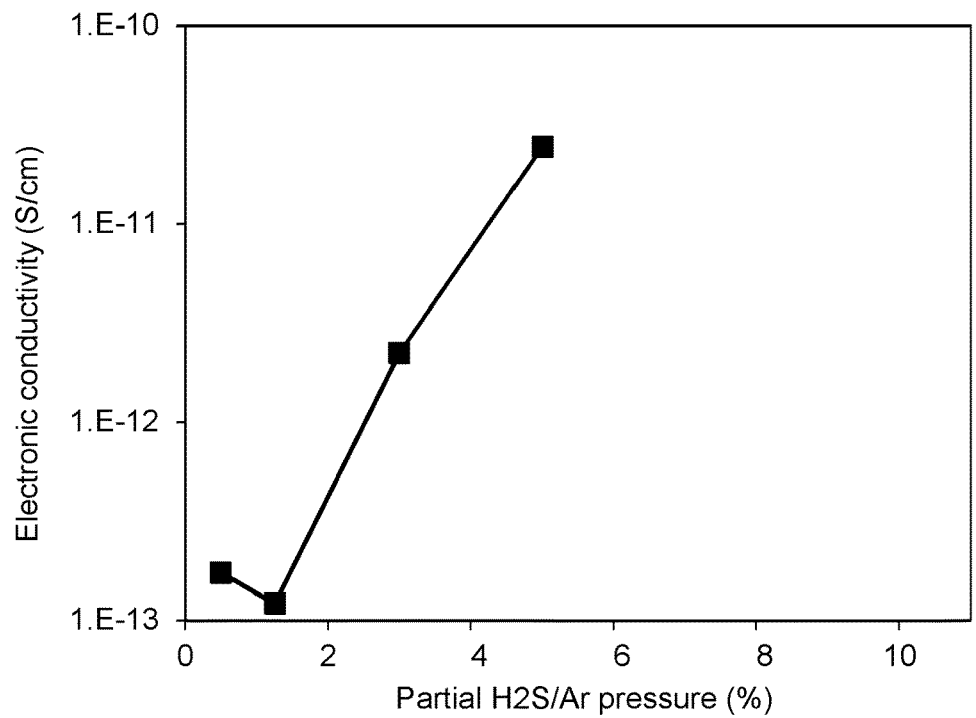
FIG. 3 presents a development curve of the electronic conductivity of an electrolyte obtained according to the invention, according to several sulphur content cases.

FIG. 3 shows the development of the electronic conductivity in S/cm according to the five levels of sulphur input obtained in this case, shown by the $H_2S$ to argon ratio in the sputtering atmosphere. Generally, an electronic conductivity as low as possible is preferable; in the present case, it tends to increase with the sulphur content but, while it could have been thought that this increase was critical for a use of LiPOS as an electrolyte, it has proven to be, that the electronic conductivity however remains sufficiently low, even with increased sulphur ratios. In the case of the measurements taken, the electronic conductivity measured with a ratio of 5% $H_2S$ in the deposition atmosphere and around $2 \cdot 10^{-11}$ S/cm which remains around six orders of magnitude lower than the ionic conductivity, i.e. an order of magnitude absolutely acceptable for the applications related to electricity storage.

Figure 4:
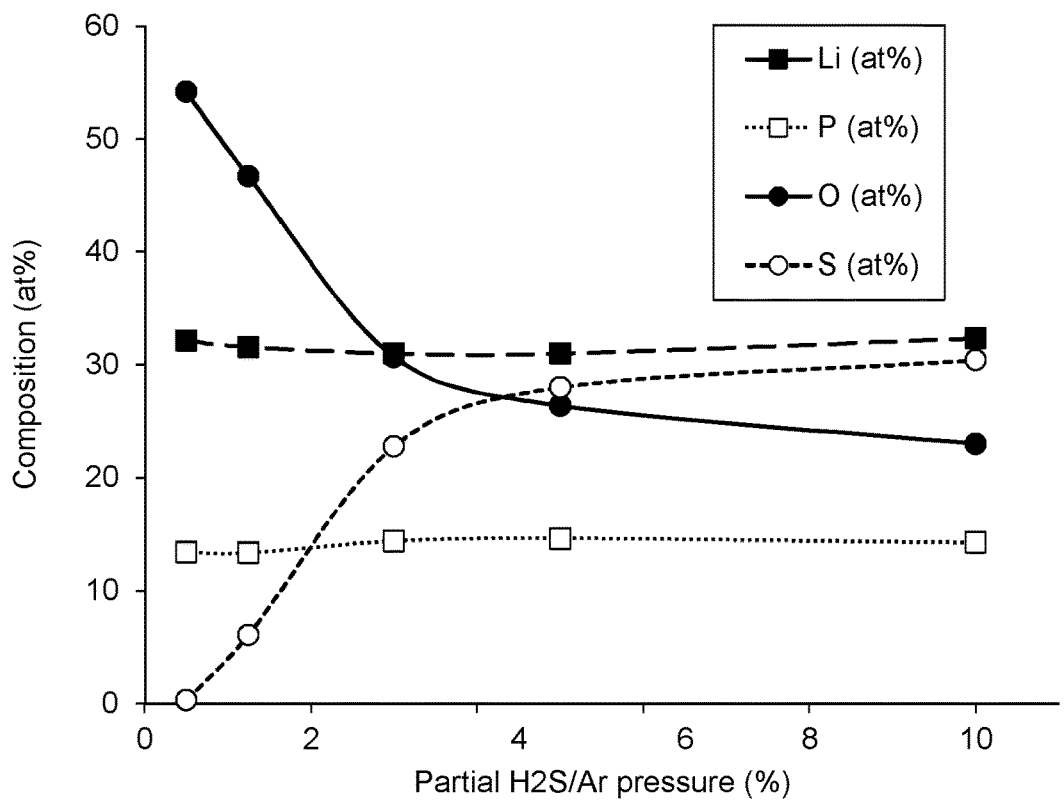
FIG. 4 gives a development of the composition of the product according to the sulphur content.

Along the same abscissa, FIG. 4 shows the development of the composition of the electrolyte.

The invention claimed is:

1. A solid electrolyte, comprising:
   at least one layer with no nitrogen and which comprises $Li_xPO_yS_z$, with $0<z\leq2$, $2.1<x\leq2.4$, and $1\leq y\leq4$.

2. The solid electrolyte according to claim 1, wherein the at least one layer consists of $Li_xPO_yS_z$, with $0<z\leq2$.

3. The solid electrolyte according to claim 1, wherein $3.7\leq y+z\leq4.1$.

4. The solid electrolyte according to claim 3, wherein $y+z=4$.

5. The solid electrolyte according to claim 1, further comprising at least one buffer layer on at least one face of the at least one layer comprising $Li_xPO_yS_z$.

6. The solid electrolyte according to claim 5, wherein the at least one buffer layer comprises LiPON.

7. The solid electrolyte according to claim 5, further comprising a buffer layer on each face of the at least one layer comprising $Li_xPO_yS_z$.

8. A battery, comprising an electrolyte according to claim 1.

9. The battery according to claim 8, further comprising, stacked on a face of a substrate:
   a first current collector;
   a first electrode;
   the electrolyte;
   a second electrode; and
   a second current collector and one or more encapsulation layers.

10. A method for producing an electrolyte according to claim 1, comprising a step of physical vapour deposition of an electrolyte layer from a $Li_3PO_4$ target sputtered under an atmosphere comprising at least one sulphur gas, so as to obtain a layer comprising $Li_xPO_yS_z$.

11. The method according to claim 10, wherein the at least one sulphur gas is $H_2S$.

12. The method according to claim 11, wherein a ratio of the at least one sulphur gas in the atmosphere is between 0.5% and 15%.

13. The method according to claim 11, wherein a ratio of the at least one sulphur gas in the atmosphere is less than or equal to 10%.

14. The method according to claim 11, wherein a ratio of the at least one sulphur gas in the atmosphere is 5%.

15. The method according to claim 10, wherein the atmosphere includes no nitrogen.

16. The solid electrolyte according to claim 1, wherein $0.06 \leq z$.

17. The solid electrolyte according to claim 1, comprising the electrolyte having an ionic conductivity greater than or equal to $10^{-6}$ S/cm.

* * * * *